US011282757B2

(12) United States Patent
Reither et al.

(10) Patent No.: US 11,282,757 B2
(45) Date of Patent: Mar. 22, 2022

(54) SEMICONDUCTOR DEVICE WITH COPPER CORROSION INHIBITORS

(71) Applicant: Infineon Technologies Austria AG, Villach (AT)

(72) Inventors: Sabine Reither, Vienna (AT); Guenter Fafilek, Bisamberg (AT); Silvia Larisegger, Vienna (AT)

(73) Assignee: Infineon Technologies Austria AG, Villach (AT)

( * ) Notice: Subject to any disclaimer, the term of this patent is extended or adjusted under 35 U.S.C. 154(b) by 364 days.

(21) Appl. No.: 16/130,362

(22) Filed: Sep. 13, 2018

(65) Prior Publication Data
US 2019/0088563 A1    Mar. 21, 2019

(30) Foreign Application Priority Data

Sep. 15, 2017   (DE) .......................... 102017121485.2

(51) Int. Cl.
*H01L 23/28* (2006.01)
*H01L 23/29* (2006.01)
(Continued)

(52) U.S. Cl.
CPC ............ *H01L 23/293* (2013.01); *H01L 21/56* (2013.01); *H01L 23/53228* (2013.01);
(Continued)

(58) Field of Classification Search
CPC ....... H01L 23/293; H01L 24/85; H01L 24/48; H01L 23/53228; H01L 21/56;
(Continued)

(56) References Cited

U.S. PATENT DOCUMENTS 5,093,712 A * 3/1992 Matsunaga ........... H01L 23/295
257/678
5,294,835 A * 3/1994 Igarashi ................ H01L 23/296
257/788
(Continued)

FOREIGN PATENT DOCUMENTS

CN         103993322 A     8/2014

OTHER PUBLICATIONS

Antonijevic, M.M., et al., "Copper Corrosion Inhibitors. A review", International Journal of Electrochemical Science, vol. 3, 2008, pp. 1-28.
(Continued)

*Primary Examiner* — Ismail A Muse
(74) *Attorney, Agent, or Firm* — Murphy, Bilak & Homiller, PLLC

(57) ABSTRACT

A semiconductor device includes a semiconductor substrate and a metal structure in electrical contact with the semiconductor substrate. The metal structure has copper as a main component. An encapsulation layer includes a matrix material and a releasable copper corrosion inhibitor dispersed in the matrix material. The matrix material of the encapsulation layer at least partially covers the metal structure. A protective layer is at least partially on and in contact with a surface of the metal structure, and disposed between the metal structure and the encapsulation layer.

27 Claims, 6 Drawing Sheets

(51) Int. Cl.
 H01L 23/00 (2006.01)
 H01L 21/56 (2006.01)
 H01L 23/532 (2006.01)
 H01L 23/495 (2006.01)
 H01L 23/31 (2006.01)

(52) U.S. Cl.
 CPC ............. *H01L 24/48* (2013.01); *H01L 24/85* (2013.01); *H01L 23/3107* (2013.01); *H01L 23/49579* (2013.01); *H01L 24/05* (2013.01); *H01L 24/45* (2013.01); *H01L 2224/05647* (2013.01); *H01L 2224/45147* (2013.01); *H01L 2224/48091* (2013.01); *H01L 2224/48247* (2013.01); *H01L 2224/8592* (2013.01); *H01L 2924/13055* (2013.01); *H01L 2924/181* (2013.01)

(58) Field of Classification Search
 CPC ................. H01L 24/05; H01L 23/3107; H01L 2924/181; H01L 2224/8592; H01L 2224/45147; H01L 23/49579; H01L 2224/48091; H01L 2924/13055; H01L 24/45; H01L 2224/48247; H01L 2224/05647
 See application file for complete search history.

(56) References Cited

U.S. PATENT DOCUMENTS

| | | | | |
|---|---|---|---|---|
| 2006/0046529 A1* | 3/2006 | McKnight | ............ | H01R 9/0515 439/66 |
| 2007/0090529 A1* | 4/2007 | McCarthy | ......... | H01L 23/49805 257/738 |
| 2008/0112143 A1* | 5/2008 | Hanley | .................. | H05K 3/301 361/752 |
| 2008/0210453 A1* | 9/2008 | Kauffman | ............... | H01B 3/308 174/11 OR |
| 2011/0089549 A1* | 4/2011 | Zenbutsu | .............. | H01L 21/565 257/676 |
| 2012/0175761 A1* | 7/2012 | Zenbutsu | ................ | C08L 63/00 257/676 |
| 2012/0261807 A1* | 10/2012 | Itoh | ...................... | C08G 59/621 257/676 |
| 2015/0344700 A1* | 12/2015 | Sjong | ....................... | B05D 7/14 524/513 |
| 2015/0368478 A1* | 12/2015 | Hamon | ..................... | C09D 5/00 428/389 |
| 2016/0064298 A1* | 3/2016 | Teh | ..................... | H01L 23/3142 257/676 |
| 2016/0084308 A1* | 3/2016 | Gorges | .................. | F16C 33/102 384/430 |
| 2016/0090486 A1* | 3/2016 | Kinlen | ............... | C07D 285/125 428/323 |
| 2016/0184759 A1* | 6/2016 | Gencer | ................... | C23F 11/00 96/111 |
| 2017/0362445 A1* | 12/2017 | Kinlen | ..................... | C09D 5/086 |
| 2019/0049527 A1* | 2/2019 | Vig | ............................ | G01B 7/30 |
| 2019/0157465 A1* | 5/2019 | Vig | ...................... | G01R 33/0047 |
| 2019/0190354 A1* | 6/2019 | Leman | ...................... | H05K 3/28 |

OTHER PUBLICATIONS

Jafari, A.H., et al., "Investigation of Smart Nanocapsules Containing Inhibitors for Corrosion Protection of Copper", Electrochimica Acta, vol. 55, Issue 28, 2010, pp. 9004-9009.

* cited by examiner

SEMICONDUCTOR DEVICE WITH COPPER CORROSION INHIBITORS

TECHNICAL FIELD

Embodiments described herein relate to semiconductor devices having a conductive structure that makes electrical contact with a semiconductor substrate.

BACKGROUND

Semiconductor devices include metal structures such as wire bonds and leads which can possibly corrode. Reducing or preventing corrosion of conductive metal structures, such as leads and wire bonding, of semiconductor devices is desirable. Metal structures of gold are generally resistant to corrosion, but it is desirable to utilize less expensive metals for electronic devices. However, less costly metals are often more active than gold, so there is a need to mitigate the problem of corrosion in metal structures used in semiconductor devices. There is interest in utilizing copper and copper alloys for bonding wire and other connections, copper being comparatively economical and of good conductivity.

SUMMARY

A semiconductor device is disclosed, in accordance with an embodiment described herein, including: a semiconductor substrate; a metal structure having a surface, the metal structure being in electrical contact with the semiconductor substrate, the metal structure containing copper as main component; an encapsulation layer having a matrix material and a releasable copper corrosion inhibitor dispersed in the matrix material, the matrix material of the encapsulation layer at least partially covering the metal structure; and a protective layer at least partially on and in contact with the surface of the metal structure and between the metal structure and the encapsulation layer.

A semiconductor device is disclosed, in accordance with an embodiment described herein, including: a semiconductor chip; a conductive metal structure containing or essentially consisting of a metal or a metal alloy and being in electrical contact with the semiconductor chip; a protective layer on the conductive metal structure in direct contact with a surface of the conductive structure; and an encapsulation layer containing a polymeric matrix material and carriers embedded in the polymeric matrix material of the encapsulation layer and/or the protective layer, the carriers containing a corrosion inhibitor for preventing or stopping corrosion of the metal or metal alloy of the conductive metal structure, the corrosion inhibitor being releasable from the carriers upon occurrence of a trigger, the conductive metal structure being at least partially embedded in the polymeric matrix material of the encapsulation layer.

A method of forming a corrosion resistant semiconductor device is disclosed, in accordance with an embodiment described herein, including: providing a semiconductor substrate having a metal structure with a surface, the metal structure being in electrical contact with the semiconductor substrate, the metal structure containing copper as main component; forming a protective layer at least partially on and in contact with the surface of the metal structure; and forming an encapsulation layer containing a matrix material and a releasable copper corrosion inhibitor dispersed in the matrix material and/or in the protective layer, the matrix material of the encapsulation layer at least partially covering the metal structure, wherein the protective layer is between the metal structure and the encapsulation layer.

A semiconductor device is disclosed, including a semiconductor chip; a conductive metal structure containing or essentially consisting of a metal or a metal alloy and being in electrical contact with the semiconductor chip; a protective layer on the conductive metal structure in direct contact with a surface of the conductive structure, the protective layer containing an inorganic matrix material and corrosion inhibitors embedded in the matrix material of the protective layer and/or the protective layer, the corrosion inhibitors for preventing or stopping corrosion of the metal or metal alloy of the conductive metal structure.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference signs designate corresponding parts. In the drawings.

DETAILED DESCRIPTION

As used herein, feature sizes in the micrometer range and smaller can be measured by electron microscopy, which is the preferred method for determining the size of features in the micrometer range or submicrometer range for the embodiments disclosed herein.

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describe an ohmic connection between two elements.

The semiconductor device is at least a two-terminal device, an example is a diode. The semiconductor device can also be a three-terminal device such as a field-effect transistor (FET), insulated gate bipolar transistor (IGBT), junction field effect transistors (JFET), and thyristors to name few. The semiconductor device can also include more than three terminals.

Specific embodiments described herein pertain to, without being limited thereto, power semiconductor devices and particularly to devices which are controlled by a field-effect.

In the Figures, like reference signs designate corresponding parts.

A "plane projection" or a "plan view" intends to describe a virtual projection of structures, elements or regions on a reference plane for describing the arrangement of the structures, elements and regions relative to each other.

Figure 1A:
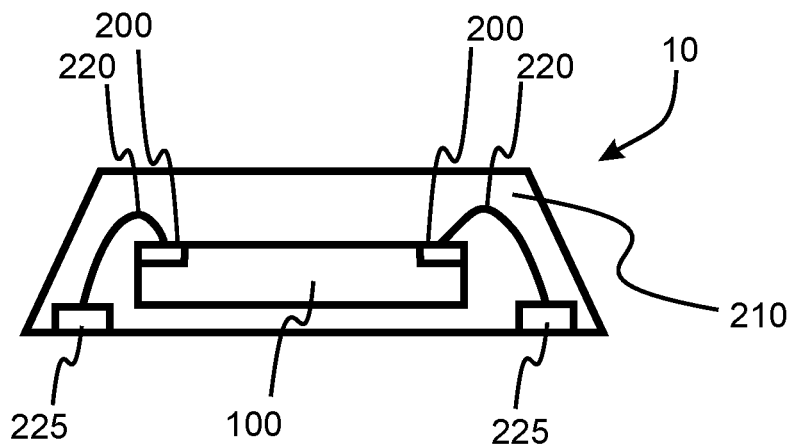
FIG. 1a illustrates a cross-sectional view of a semiconductor device.

FIG. 1a illustrates a semiconductor device 10 which can include a semiconductor substrate 100, and metal structures which may include pads 200, 225 and wires 220. The metal structure can be in electrical contact with the semiconductor substrate 100. The metal structure can include copper, particularly as a main component. Copper may be desired due to its good conductivity and other material properties. Copper may be desirable due to economic factors also. The wires 220 can be in electrical contact with the pads 220, 225, which may be in direct or indirect electrical contact with the semiconductor substrate 100, such as a highly doped region thereof.

A molding 210, such as one made from a plastic resin, can be used to protect, to some extent, the semiconductor device 10 from the environment. The substrate 100 and the metal structure can be at least partially, or completely, embedded in the molding 210. The molding may include a thermosetting plastic, thermoplastic, and/or a ceramic, for example.

Figure 1B:
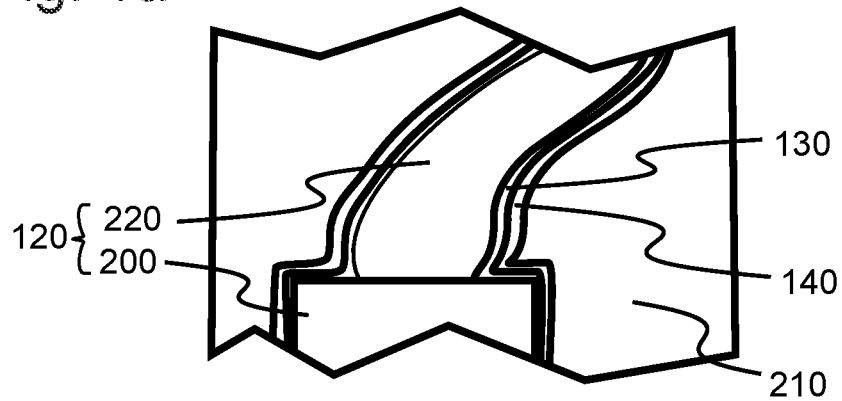
FIG. 1b illustrates a cross-sectional view of a portion of a semiconductor device including a metal structure.

FIG. 1b illustrates, according to an embodiment described herein, a region of the semiconductor device 10. FIG. 1b shows a pad 200 in electrical contact with a wire 220, the pad 200 and wire 220 making up at least part of a metal structure 120 which can be at least partially covered by a protective layer 130 and/or an encapsulation layer 140. The metal structure 120 may be a copper pad and/or a copper wire, for example. FIG. 1b shows a protective layer 130 which can be at least partially on and in contact with the surface of the metal structure 120, and between the metal structure 120 and an encapsulation layer 140. The encapsulation layer 140 may be in the vicinity of the protective layer 130, and may at least partially cover the protective layer 130.

After wire bonding, and prior to molding, the metal structure 120 can possibly be treated with a chromate layer which may exhibit corrosion inhibition. However, chromate may be undesirable, as its use may negatively impact the environment. Some devices may utilize so-called protected copper, such as copper with a thin aluminum oxide layer as a protective layer 130 deposited over at least part of the metal structure 120, such as the wire 220 and/or pad 200. It is nevertheless possible for the protective layer 130 to be at least partly damaged, particularly the protective layer 130 at or around the pad 200, such as during wire bonding. Alternatively/additionally, the protective layer 130 may be applied to the metal structure 120 after bonding.

In an embodiment, the metal structure 120 includes copper, which is used in combination with an oxide protective layer 130, such as a conductive oxide protective layer 130, such as a thin conductive film of $Al_2O_3$. The protective layer 130 can include or essentially consist of an inorganic material selected from the group of metal oxides and metals which are more noble than copper. In a further embodiment, the protective layer 130 can include or essentially consists of an organic material.

The protective layer 130 may be free of chromium. It may be desirable to reduce or eliminate the amount of chromium in semiconductor devices due to environmental concerns associated with the use of chromium. The protective layer 130, which can be conductive, can include an inorganic material selected from the group of metal oxides and metals which are more noble than copper, such as aluminum oxide (e.g. $Al_2O_3$), particularly thin film (conductive) aluminum oxide and/or platinum. The protective layer 130 may contribute to the protection of the underlying metal structure from corrosion, for example, by preventing diffusion of corroding species of the environment to the surface 127 of the metal structure 120. Nevertheless, it is possible in some situations for chloride ions in the environment of the metal structure to accelerate or initiate corrosion. Alternatively/additionally, metal surfaces covered by imide or other polymers, for example, possibly those of the molding 210, can be subject to some corrosion, since polymers may include water and/or electrolytes which may enable unwanted corrosive chemical reactions. Typically, the molding 210 is much thicker than the encapsulation layer 140 and the protective layer 130. The molding 210 may be completely encapsulating the semiconductor substrate 100 or chip.

Figure 1C:
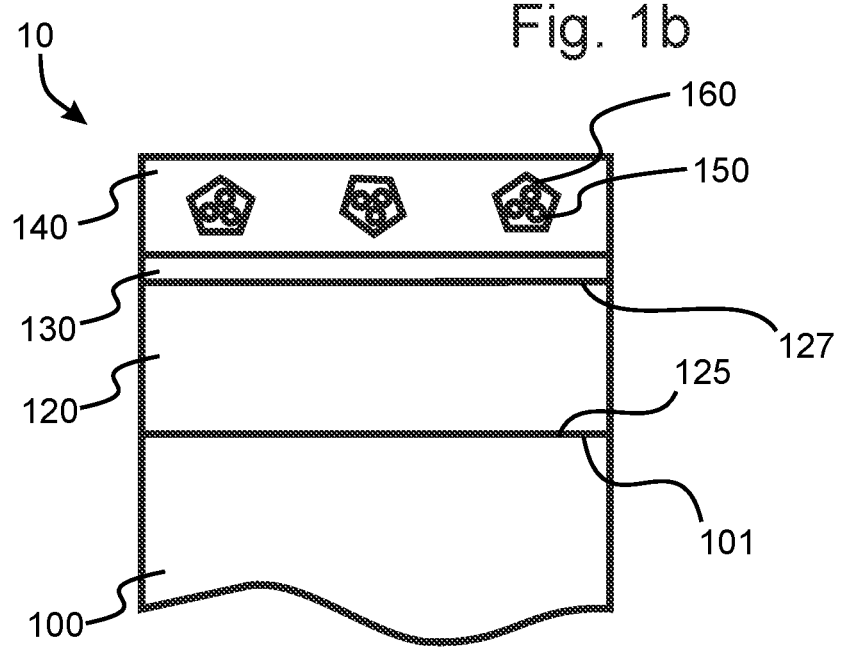
FIG. 1c illustrates a cross-sectional view of a portion of a semiconductor device including a metal structure.

FIG. 1c illustrates, according to an embodiment described herein, a cross-sectional region of the semiconductor device 10. The semiconductor device 10 can include a semiconductor substrate 100 which may include a PN junction. The semiconductor substrate 100 may be in electrical contact, such as direct electrical contact, with a metal structure 120. The semiconductor substrate can include a highly doped region that may be in electrical contact with the metal structure 120, such as direct electrical and physical contact. For example, the metal structure 120 can be in electrical contact with a semiconductor surface 101 of the semiconductor substrate 100. An interfacing surface 125 of the metal structure 120 can be in direct electrical and physical contact with the semiconductor surface 101 of the semiconductor substrate 100, such as at a highly doped region thereof.

The encapsulation layer 140, seen in FIG. 1c, can include a matrix material (such as a polymer) and an optionally releasable corrosion inhibitor 150 dispersed in the matrix material. As depicted in FIG. 1c, the releasable corrosion inhibitor 150 is associated with an optional carrier 160. The corrosion inhibitor may be a copper corrosion inhibitor, particularly if the metal structure 120 includes copper. The matrix material of the encapsulation layer 140 may at least partially cover the metal structure 120. The encapsulation layer 140 may cover at least partially the protective layer 130.

According to an embodiment, the protective layer 130 is thinner than the encapsulation layer 140. For example, in case of a protective layer 130 made of an oxide material, the thickness of the protective layer 130 can be equal to or less than 1 µm for example equal to or less 200 nm, or equal to or less than 100 nm. Oxidic protective layers 130 can be formed using atomic layer deposition which leads to the deposition of only few atomic layers. If a polymeric material is used for the protective layer 130, such as a resist or epoxy material, the layer thickness of the protective layer 130 may be less than few micrometers, such as less than 10 µm, or equal to or less than 5 µm.

In an embodiment, the encapsulation layer 140 includes carriers 160 embedded in the matrix material of the encapsulation layer 140 and containing the copper corrosion inhibitor 150 which are releasable from the carriers.

A thin encapsulation layer 140 may be desirable to save on materials costs. In some embodiments, the encapsulation layer 140 is of limited thickness (such as less than 100 µm, less than 50 µm, less than 20 µm, less than 10 µm, less than 5 µm, or less than 3 µm thick) since thicker layers might not reasonably allow for any significant mass transport capability of the inhibitor toward the surface 127. Mass transport of the inhibitor 150 to the surface 127 may occur through additional or alternative mechanisms than diffusion.

The corrosion inhibitor 150 can inhibit and/or prevent the corrosion of copper. A copper corrosion inhibitor 150 can include an inorganic compound, an organic compound, or a mixture thereof. For example, the copper corrosion inhibitor 150 can include an inorganic cation such as $Ce^{+3}$, $Zn^{+2}$, and/or $La^{+3}$. The copper corrosion inhibitor 150 can include an inorganic anion such as $MoO_4^{-2}$. The copper corrosion inhibitor can include at least one of: benzotriazole, salicylaldoxime, 8-hydroxyquinolone, and quinaldic acid.

The corrosion inhibitor 150 can be in the protective layer 130 and/or encapsulation layer 140. An inhibitor 150 can be a combination of an organic inhibitor and an inorganic inhibitor; particularly an inorganic inhibitor that includes molybdate. Alternatively/additionally, a molybdate species is at least a component of the inhibitor. For example, inhibitors may interact with copper ions, such as those generated during copper corrosion of a copper containing metal structure 120; the interaction may form insoluble complexes which cement on the copper containing surface 127 and block the metal structure 120 from further reaction with corrosive materials or corrosion enhancing materials from the environment. Copper corrosion inhibitors that are free of sulfur are particularly possible. Sulfur containing compounds may enhance rather than inhibit copper corrosion.

The possible inhibitors salicylaldoxime, 8-hydroxyquinolone, and quinaldic acid, may each be used alone or in combination with each other or other inhibitors. The inhibitor may include or essentially consist of an inorganic compound, an organic compound, or a mixture of an inorganic compound and an organic compound. In yet another embodiment, that may be combined with any other embodiment described herein, the corrosion inhibitor contains or essentially consists of an inorganic compound containing at least one of $Ce^{+3}$, $Zn^{+2}$, $La^{+3}$, and $MoO_4^{-2}$.

For example, $Ce^{+3}$, $Zn^{+2}$, $La^{+3}$, may be useful cations for inhibitors, and $MoO_4^{-2}$ may be a useful anion. The combination $ZnMoO_4$ is particularly possible as at least one component of an inhibitor 150.

The inhibitors 150 can be associated with a carrier 160. For example, the inhibitors 150 can be within pores of the carrier 160. The carrier 160 may prevent undesirable diffusion of the inhibitor 150, such as out of the encapsulation layer 140 and/or into the molding 210. The carrier 160 can immobilize the inhibitor 150 to reduce/prevent diffusion of the inhibitor 150, such as until the inhibitor 150 is released, such as by a trigger.

The carriers 160 can be embedded in the matrix material of the encapsulation layer 140, and can contain a corrosion inhibitor 150 which can be released from the carrier 160. The mean size of the carrier 160 can be less than 1 µm. The carriers 160 may be micrometer sized, such as averaging less than 5 µm, less than 2 µm, or less than 1 µm. The carriers 160 can be selected from the group of: $SiO_2$-nanocapsules, $SiO_2$-mesoporous particles, halloysites, hydroxyapatites, layered double hydroxides, and zeolites. Alternatively/additionally, the carrier 160 may be a layered structure.

The carrier 160 can include (or can essentially consist of) inorganic porous particles, such as $SiO_2$ mesoporous particles, and the (copper) corrosion inhibitor can be in the pores of the $SiO_2$ mesoporous particles. The release of the (copper) corrosion inhibitor can be, particularly in the case of $SiO_2$ mesoporous particles as the carrier 160, triggerable by a lowering of pH.

In an embodiment that can be combined with any other embodiment described herein, the metal structure is a conductive metal structure containing a metal or metal alloy in electrical contact with the semiconductor chip 100. The protective layer 130 can be on the conductive metal structure 120 and be in direct contact with a surface of the conductive structure. The encapsulation layer 140 can include a polymeric matrix material and carriers 160 embedded in the matrix material. The carriers 160 can contain a corrosion inhibitor 150 for preventing or stopping corrosion of the metal or metal alloy of the conductive metal structure 120. The corrosion inhibitor can be releasable from the carriers 160 upon occurrence of a trigger. The conductive metal structure 120 can be at least partially embedded in the matrix material of the encapsulation layer 140.

Figure 2A:
FIGS. 2a, 2b, 2c, and 2d illustrate a cross-sectional view of a protected metal structure undergoing corrosion.
Figure 2B:
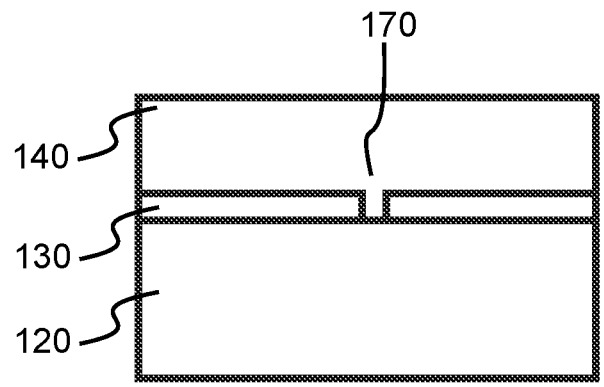

FIGS. 2a to 2d depict a corrosion process, according to embodiments described herein. FIG. 2a shows the metal structure 120, the protective layer 130, and the encapsulation layer 140. It is possible that a crack 170 or the like develops in the protective layer 130, which can expose a surface of the metal structure 120 (FIG. 2b). The crack 170 can be regarded as a failure site, such as a mechanical failure, which might be caused by stress. Although the failure site might be very small, even submicroscopic, there may be significant corrosion as a result, which can lead to device failure.

Figure 2C:
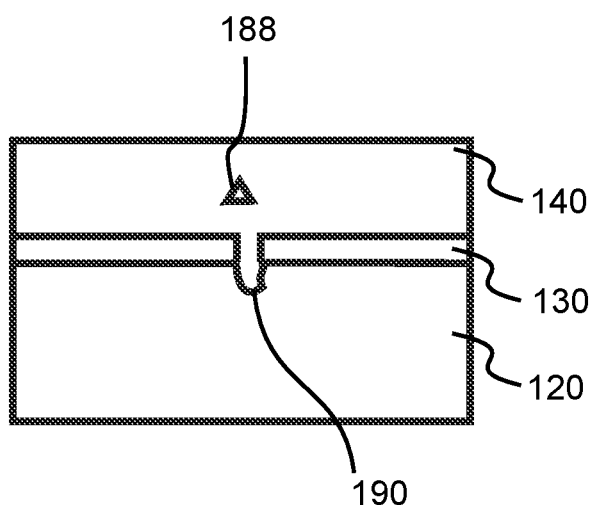
Figure 2D:
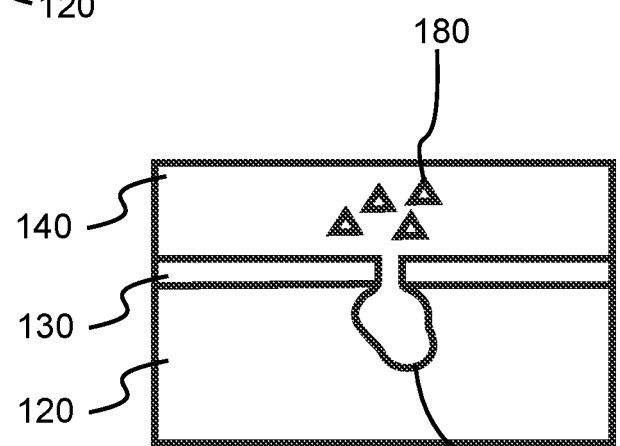

An exposed portion of a metal structure 120 may be more susceptible to corrosion. As depicted in FIG. 2c, a corrosion pit 190 may form, and this may release chemical species 188 such as H⁺, which can possibly act as a trigger 180, as explained with respect to FIGS. 5 and 6, for triggering the release of a corrosion inhibitor 150. In FIGS. 2a-d, no inhibitor 150 is depicted, the corrosion pit 190 continuing to grow as depicted in FIGS. 2c and 2d. It is notable that the small size of the crack 170, the correspondingly small exposed area of the metal structure 120, and the relatively large area of the protective layer 130, may work together so as to result in a substantially fast rate of local corrosion. In other words, the relatively large area of the protective layer 130 may act as a large area cathode, and may act as a sink for electrons produced in the corrosion process that can occur at the anode, e.g. site of the exposed metal structure 120 (or the pit 190). The possibly substantial size difference of the anode and cathode can result in rapid and undesirable corrosion, such as pitting corrosion, in the metal structure 120 at the position of the defect or crack 170 of the protective layer 130. The current density at the defect site may be quite high so as to result in rapid electrochemical corrosion.

For example, although a crack 170 or the like may expose only a small area of copper as an anode (the metal structure 120), in comparison to a large area covered with $Al_2O_3$ which acts as a cathode (the protective layer 130), the electrochemical cell that is formed is such that the local rate of corrosion at the failure site 170 is significant, rapidly forming a pit 190, locally. The protective layer 130 may be functioning as designed, providing protection to corrosion, where it is undamaged, but the small failure 170, where the underlying metal may be exposed and undergo accelerated pitting corrosion, possibly ultimately causing device failure.

Without being bound by theory, it is possible that, if the corrosion reaction produces/releases a (by-)product 188, such as metal ions and/or $H^+$, particularly at the crack or pit, a substantially high concentration of the (by-)product 188 may be present locally near the crack 170 and/or pit 190. The local concentration may be high enough to generate a substantial concentration gradient of the (by-)product. Alternatively, there may be alteration (an increase or decrease) of the local concentration of a chemical species which is related to the (by-)product. It is alternatively/additionally possible that a concentration gradient of the (by-)product is formed.

For example, many corrosion reactions will release $H^+$, and it is possible, upon initiation of corrosion, for the local pH to drop, at least in comparison to the pH of the region around the corrosion site before the corrosion is initiated. A spatial pH gradient may form as corrosion is initiated and progresses, such as at the site of corrosion. Alternatively/additionally, the corrosion may release metal ions, forming a local concentration of metal ions (e.g. copper ions) which may generate a concentration gradient of metal ions. Alternatively/additionally, the generated metal ions (and/or $H^+$) may react, for example, with a species such as a precursor species in the encapsulation layer 140, so as to generate a local concentration (and possible gradient) of some other chemical species.

Alternatively/additionally a different environmental influence can initiate corrosion, such as presence of chloride ions. The corrosion reaction can be autocatalytic. For example, a pH change generated by the initiation of corrosion may accelerate the corrosion reaction further. It is possible that subsequent device failure can result.

Herein, self-healing systems are disclosed, for protecting metal structures of semiconductor devices from corrosion, for example, for use in oxide layer protected copper in semiconductor devices. In some embodiments, the self-healing systems can be triggered by environmental inputs, such as pH triggered release of inhibitors 150 that inhibit corrosion, copper dissolution, and the like. The corrosion inhibitor 150 can be in the protective layer 130 and/or encapsulation layer 140 so as to be available to slow, stop, and/or heal a corrosion process at a failure site 170 or the like, such as a crack or other defect.

Figure 3A:
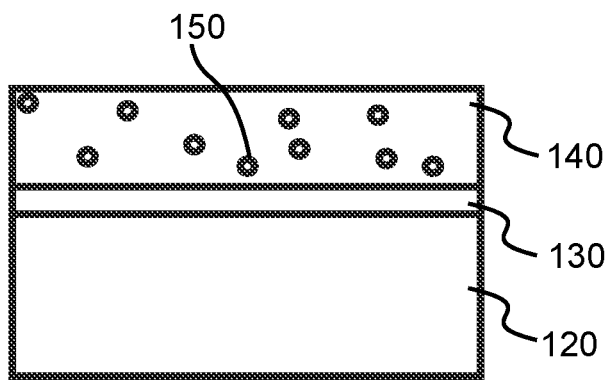
FIGS. 3a, 3b, 3c, and 3d illustrate a cross-sectional view of a protected metal structure in which corrosion is inhibited by an inhibitor.
Figure 3B:
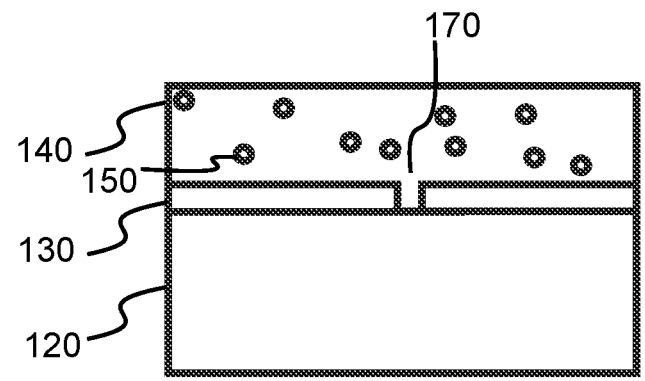
Figure 3C:
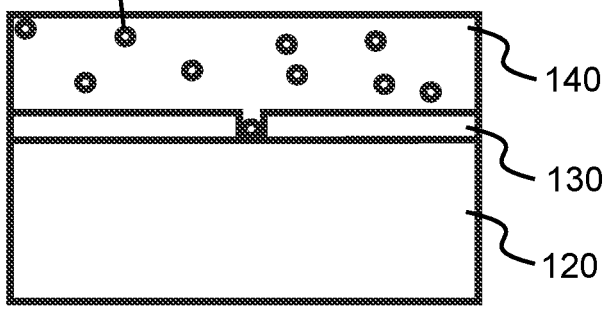
Figure 3D:
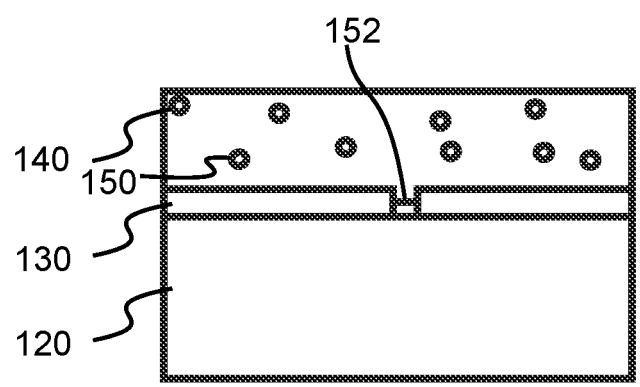

FIGS. 3a-d illustrate corrosion inhibition according to embodiments described herein. The encapsulation layer 140 may contain corrosion inhibitors 150 which may be subject to diffusion and/or other mass transport mechanisms. When a crack 170 occurs in the protective layer 130 (see FIG. 3b), the corrosion inhibitors 150 may be free to diffuse into the crack 170 (see FIG. 3c) and adsorb to the exposed surface of the metal structure 120. An adsorbed inhibitor 152 is depicted in FIG. 3d. The adsorbed inhibitor 152 may reduce the rate or prevent (further) corrosion. For example, the adsorbed inhibitor 152 may be benzotriazole, or mixtures including benzotriazole.

Alternatively/additionally to diffusive mass transport effects, the inhibitors 150 may be subject to the influence of a local electrical field that might induce movement, particularly, of ionic inhibitors. Alternatively/additionally, the inhibitors 150 might move under the influence of a pH gradient, such as one resulting from $H^+$ generated by local corrosion.

In FIGS. 4a, 4b, 4c, and 4d, an embodiment which may be combined with any other embodiment described herein, is depicted in which the inhibitor 150 is releasable from carriers 160. The carriers 160 may be embedded in the matrix material of the encapsulation layer 140. The carriers 160 may include, or may essentially consist of, inorganic porous particles. The pores of carriers 160 may contain the corrosion inhibitor 150 or a precursor thereof. The precursor may react so as to generate the inhibitor 150.

Figure 4A:
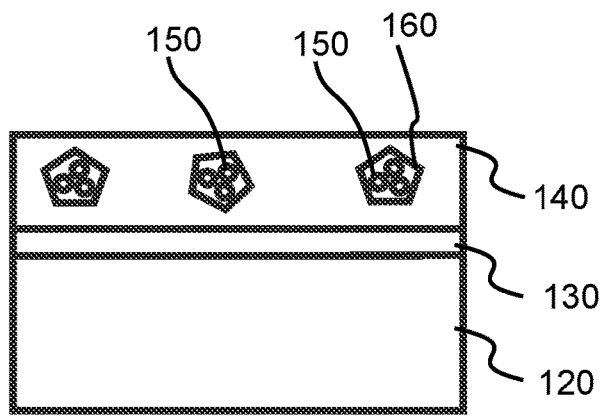
FIGS. 4a, 4b, 4c, and 4d illustrate a cross-sectional view of a protected metal structure in which corrosion is inhibited by a copper corrosion inhibitor.

FIG. 4a illustrates the inhibitors 150 associated with the carrier 160, such as within pores of the carrier 160 and/or adsorbed to the carrier 160. Alternatively/additionally, the inhibitors 150 may be encapsulated by and/or dispersed within the carrier 160.

Figure 4B:
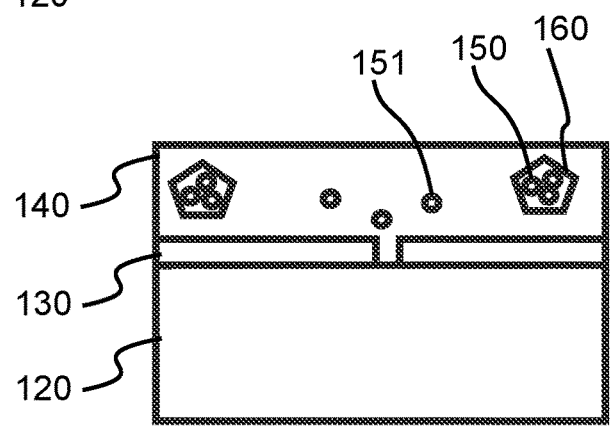
Figure 4C:
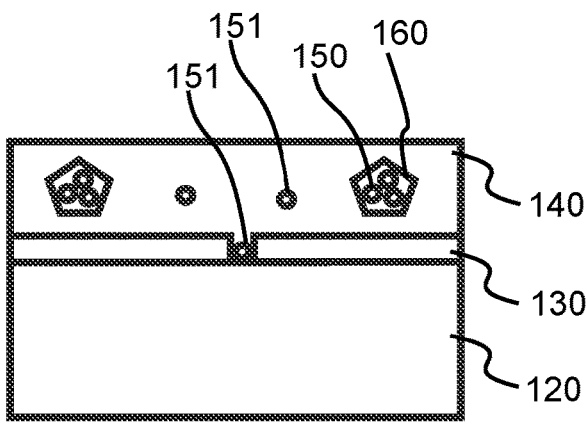
Figure 4D:
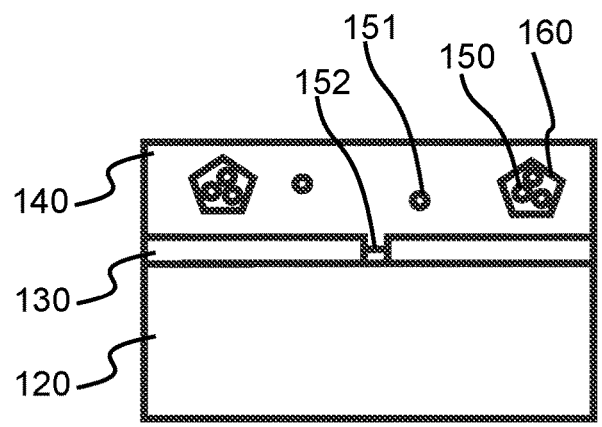

FIG. 4b depicts the released inhibitor 151 released from the carrier 160. The inhibitor 150 release may be due to slow release of the inhibitor from carriers 160, and/or may be triggered. The released inhibitor 151 may diffuse through the encapsulation layer 140, or may undergo additional/alternative mass transport processes to the surface of the metal structure 120 (see FIG. 4c). The inhibitor may adsorb to the surface of the metal structure 120, forming an adsorbed or chemically bound inhibitor 152, as depicted in FIG. 4d. The adsorbed inhibitor 152 may reduce the rate or prevent (further) corrosion.

Figure 5A:
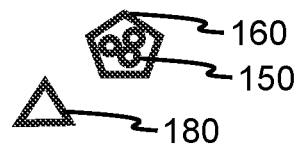
FIGS. 5a, 5b, 5c, and 5d illustrate triggered release of a copper corrosion inhibitor.
Figure 5A:
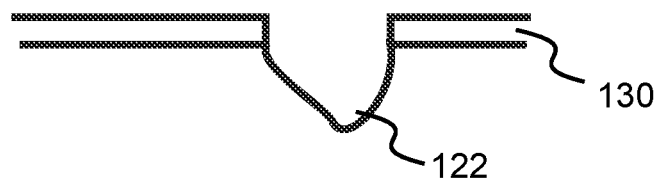

In FIGS. 5a, 5b, 5c, and 5d, an embodiment which may be combined with any other embodiment described herein, is depicted in which the release of the inhibitor 150 is triggered by a trigger 180. In FIG. 5a, a corrosion pit 122 has formed, exposing a surface of the metal structure beneath the protective layer 130. The corrosion can be correlated with the generation of a trigger 180, which may be regarded a stimulus for a carrier 160, e.g. a stimulus for a "smart carrier."

Figure 5B:
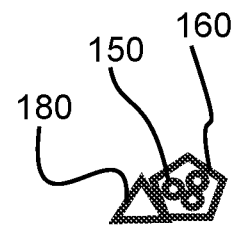
Figure 5B:
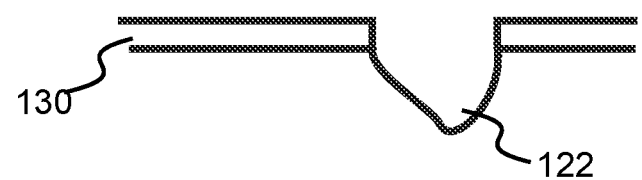
Figure 5C:
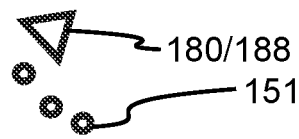
Figure 5C:
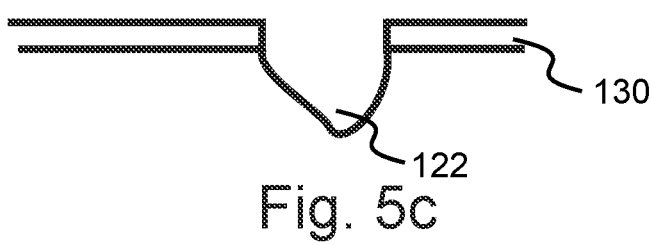
Figure 5D:
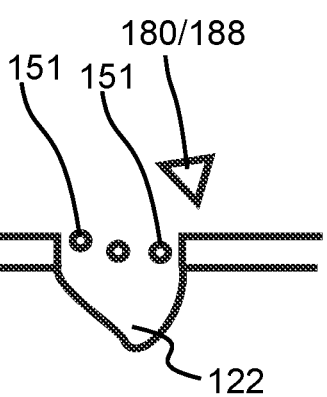

As depicted in FIGS. 5b and 5c, a trigger 180 and/or stimulus may cause the release of inhibitors 150 from a carrier 160, generating released inhibitors 151. The stimulus may be a mechanical rupture, time, and/or a chemical trigger. Local corrosion reactions may generate pH gradients and/or aggressive ions which are suitable as triggers 180 for releasing the inhibitors 150 from the carriers 160. The trigger 180 may be a chemical (by-)product 188, such as chloride, $H^+$, and/or an ion such as a metal ion. Release of the inhibitors 150 may be due to the partial or complete dissolution of the carrier 160. As depicted in FIG. 5d, at least some of the released inhibitors 151 can be transported to the corrosion site such as corrosion pit 122.

In an embodiment, the carrier 160 is $SiO_2$ mesoporous particles; the corrosion inhibitor 150 is in pores of the $SiO_2$ mesoporous particles; and the release of the copper corrosion inhibitor 150 is triggerable by a lowering of pH. Yet furthermore, the mesoporous particles can be less than 1 μm diameter. The encapsulation layer 140 can include the mesoporous particles embedded and/or dispersed within a polymer matrix of the encapsulation layer 140.

Figure 6A:
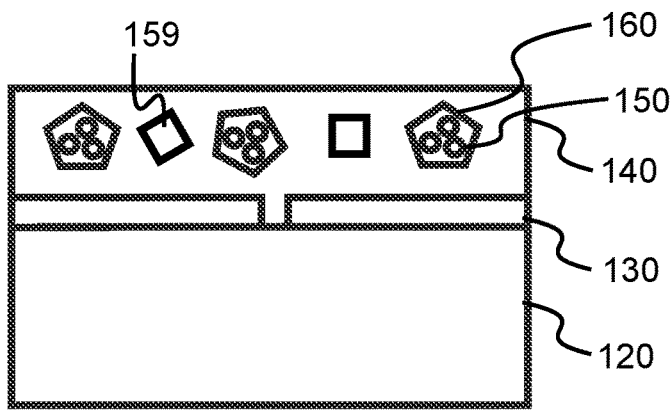
FIGS. 6a, 6b, 6c, and 6d illustrate a cross-sectional view of a protected metal structure in which corrosion is inhibited by a copper corrosion inhibitor.
Figure 6B:
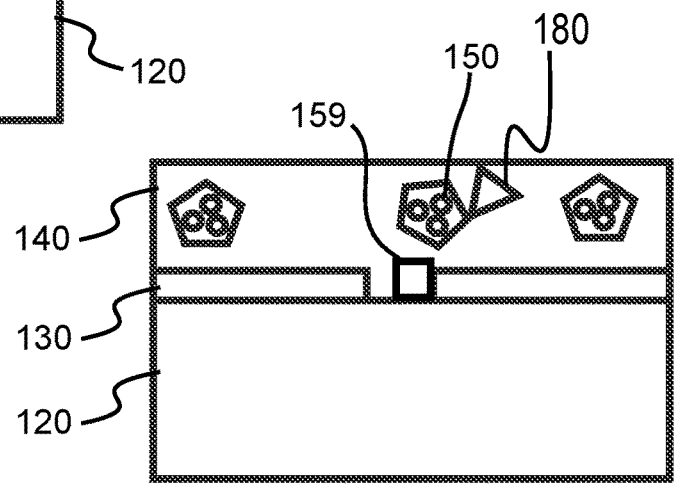
Figure 6C:
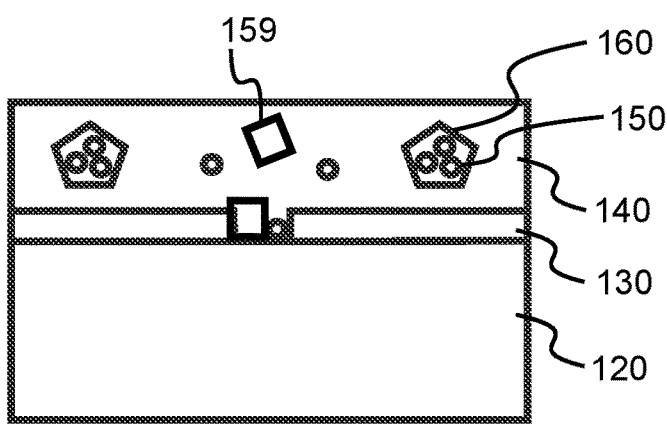
Figure 6D:
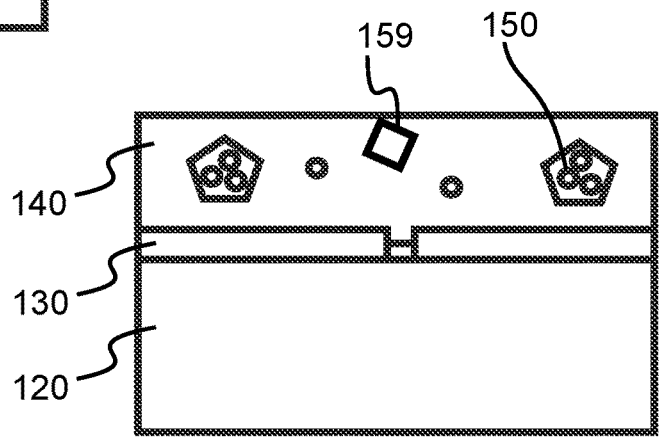

FIGS. 6a, 6b, 6c, and 6d depict two kinds of inhibitors 150, 159 in the encapsulation layer 140. At least one of the first inhibitor 150 and the second inhibitor 159 may be associated with a carrier 160, and may undergo triggered release, such as pH activated release. As depicted in FIG. 6a, the second inhibitor 159 is located in the matrix of the encapsulation layer 140, and the first inhibitor 150 is associated with a carrier 160. The second inhibitor 159 may diffuse to the surface of the metal structure 120 (FIG. 6b) and/or by other mass transport mechanism, with or without having been triggered. The second inhibitor 159 may adsorb to the surface of the metal structure 120. The first inhibitor 150 can be released due to a trigger 180, or may act without being triggered. For example, a trigger 180 may chemically react with the carrier 160 to release the inhibitor 150, as depicted in FIGS. 6b and 6c. The released first inhibitor 150 may adsorb to the surface of the metal structure 120. It is also possible that each of the first and second inhibitors 150, 159 is associated with the same carrier 160. For example, the first and second inhibitors 150, 159 each are distributed within the pores of a zeolite, porous nanoparticle, microparticle, or the like.

In an embodiment that may be combined with any other embodiment described herein, the carrier 160 is a double doped zeolite, which includes at least two chemically distinct species of inhibitors 150, 159. Optionally, the release kinetics and/or release mechanisms of each of the respective inhibitors 150, 159 from the carrier 160 are different from the other, such as a fast release and a slow release. For example, one release mechanism may be ion triggered, and may occur at a different rate. It is also possible that a mixture of different types of carriers 160 with, optionally, different or the same type of inhibitor 150 is used. This may allow for greater flexibility of inhibitor activation.

In an embodiment, a method of forming a corrosion resistant semiconductor device includes: providing a semiconductor substrate 100 having a metal structure 120 with a surface, the metal structure 120 being in electrical contact with the semiconductor substrate 100, the metal structure 120 containing copper as main component; forming a protective layer 130 at least partially on and in contact with the surface of the metal structure 120; and forming an encapsulation layer 140 including a matrix material and a releasable copper corrosion inhibitor 150 dispersed in the matrix material, the matrix material of the encapsulation layer 140 at least partially covering the metal structure 120, wherein the protective layer 130 is between the metal structure 120 and the encapsulation layer 140.

Various embodiments according to the present invention have been described. They have been presented by way of illustration and example only, and not limitation. It will be apparent to persons skilled in the relevant art that various changes in form and detail can be made. Thus, the breadth of the invention is not limited by any of the exemplary embodiments, but is defined in accordance with the claims, including equivalents. Each feature of each embodiment discussed herein can be used in combination with the features of any other embodiment.

The invention claimed is:

1. A semiconductor device, comprising:
a semiconductor substrate;
a metal structure comprising a surface, the metal structure being in electrical contact with the semiconductor substrate, the metal structure comprising copper as a main component;
an encapsulation layer comprising a matrix material and a releasable copper corrosion inhibitor dispersed in the matrix material, the matrix material at least partially covering the metal structure;
a protective layer at least partially on and in contact with the surface of the metal structure, and disposed between the metal structure and the encapsulation layer; and
a molding in which the semiconductor substrate and the metal structure with the protective layer and the encapsulation layer are at least partially embedded,
wherein the molding is thicker than the protective layer and the encapsulation layer,
wherein the molding comprises a different material than the protective layer and the encapsulation layer.

2. The semiconductor device of claim 1, wherein the protective layer comprises an inorganic material selected from the group consisting of metal oxides and metals which are more noble than copper.

3. The semiconductor device of claim 1, wherein the matrix material of the encapsulation layer comprises a polymeric material.

4. The semiconductor device of claim 1, wherein the encapsulation layer comprises carriers embedded in the matrix material and containing the copper corrosion inhibitor which are releasable from the carriers.

5. The semiconductor device of claim 4, wherein the carriers are selected from the group consisting of: $SiO_2$ nanocapsules; $SiO_2$ mesoporous particles; halloysites; hydroxyapatites; layered double hydroxides; and zeolites.

6. The semiconductor device of claim 4, wherein a mean size of the carriers is less than 1 μm.

7. The semiconductor device of claim 4, wherein a release of the copper corrosion inhibitor from the carriers is triggerable by mechanical rupture, time, and/or a chemical trigger.

8. The semiconductor device of claim 1, wherein the copper corrosion inhibitor comprises an inorganic compound, an organic compound, or a mixture of an inorganic compound and an organic compound.

9. The semiconductor device of claim 8, wherein the copper corrosion inhibitor comprises an inorganic cation.

10. The semiconductor device of claim 8, wherein the copper corrosion inhibitor comprises an inorganic anion.

11. The semiconductor device of claim 8, wherein the copper corrosion inhibitor comprises benzotriazole, salicylaldoxime, 8-hydroxyquinolone and/or quinaldic acid.

12. The semiconductor device of claim 8, wherein the copper corrosion inhibitor is a combination of an organic inhibitor and an inorganic inhibitor.

13. The semiconductor device of claim 4, wherein the carriers are $SiO_2$ mesoporous particles, the copper corrosion inhibitor is in pores of the $SiO_2$ mesoporous particles, and the release of the copper corrosion inhibitor is triggerable by a lowering of pH.

14. The semiconductor device of claim 1, wherein the protective layer is free of chromium.

15. The semiconductor device of claim 1, wherein the metal structure comprises a copper pad and/or a copper wire.

16. A semiconductor device, comprising:
a semiconductor chip;
a conductive metal structure comprising a metal or a metal alloy and being in electrical contact with the semiconductor chip;
a protective layer in direct contact with a surface of the conductive metal structure;

an encapsulation layer comprising a polymeric matrix material and carriers embedded in the polymeric matrix material of the encapsulation layer, the carriers containing a corrosion inhibitor for preventing or stopping corrosion of the metal or metal alloy of the conductive metal structure, the corrosion inhibitor being releasable from the carriers upon occurrence of a trigger, the conductive metal structure and the protective layer being at least partially in contact with the polymeric matrix material; and a molding in which the semiconductor chip and the conductive metal structure with the protective layer and the encapsulation layer are at least partially embedded, wherein the molding is thicker than the protective layer and the encapsulation layer, wherein the molding comprises a different material than the protective layer and the encapsulation layer.

17. The semiconductor device of claim 16, wherein the carriers comprise inorganic porous particles having pores and containing the corrosion inhibitor, or a precursor of the corrosion inhibitor, in the pores.

18. The semiconductor device of claim 16, wherein the metal or metal alloy of the conductive metal structure comprises copper as a main component.

19. The semiconductor device of claim 16, wherein the protective layer comprises a metal oxide.

20. The semiconductor device of claim 16, wherein the corrosion inhibitor comprises an inorganic compound containing $Ce^{+3}$, $Zn^{+2}$, $La^{+3}$, and/or $MoO_4^{-2}$.

21. The semiconductor device of claim 16, wherein the corrosion inhibitor comprises an organic compound containing benzotriazole, salicylaldoxime, 8-hydroxyquinolone, and/or quinaldic acid.

22. A method of forming a corrosion resistant semiconductor device, the method comprising:

providing a semiconductor substrate comprising a metal structure with a surface, the metal structure being in electrical contact with the semiconductor substrate, the metal structure comprising copper as a main component;

forming a protective layer at least partially on and in contact with the surface of the metal structure;

forming an encapsulation layer comprising a matrix material and a releasable copper corrosion inhibitor dispersed in the matrix material, the matrix material at least partially covering the metal structure, wherein the protective layer is disposed between the metal structure and the encapsulation layer; and at least partially embedding the semiconductor substrate and the metal structure with the protective layer and the encapsulation layer in a molding, wherein the molding is thicker than the protective layer and the encapsulation layer, wherein the molding comprises a different material than the protective layer and the encapsulation layer.

23. The method of claim 22, wherein the encapsulation layer comprises carriers embedded in the matrix material of the encapsulation layer and containing the copper corrosion inhibitor which are releasable from the carriers.

24. The method of claim 22, wherein the protective layer comprises an inorganic material selected from the group consisting of metal oxides and metals which are more noble than copper.

25. The method of claim 22, wherein the copper corrosion inhibitor comprises an inorganic compound, an organic compound, or a mixture of an inorganic compound and an organic compound.

26. A semiconductor device, comprising:

a semiconductor chip;

a conductive metal structure comprising a metal or a metal alloy and being in electrical contact with the semiconductor chip;

a protective layer in direct contact with a surface of the conductive metal structure, the protective layer comprising an inorganic matrix material and corrosion inhibitors embedded in the inorganic matrix material, the corrosion inhibitors configured to prevent or stop corrosion of the metal or metal alloy of the conductive metal structure; and a molding in which the semiconductor chip and the conductive metal structure with the protective layer are at least partially embedded, wherein the molding is thicker than the protective layer and comprises a different material than the protective layer.

27. The semiconductor device of claim 26, wherein the conductive metal structure comprises copper.

* * * * *